(12) United States Patent
Dachs et al.

(10) Patent No.: US 7,286,899 B2
(45) Date of Patent: Oct. 23, 2007

(54) PROCESS BOARD WITH MODULAR SPC INTEGRATION AND EXPANSION

(75) Inventors: Oswald Dachs, Eckental (DE); Dieter Reinecke, Cadolzburg (DE); Karl-Rudolf Lüttich, Bad Frankenhausen (DE); Rainer Nickl, Nürnberg (DE)

(73) Assignee: Demag Ergotech GmbH, Schwaig (DE)

( * ) Notice: Subject to any disclaimer, the term of this patent is extended or adjusted under 35 U.S.C. 154(b) by 314 days.

(21) Appl. No.: 11/148,883

(22) Filed: Jun. 9, 2005

(65) Prior Publication Data
US 2005/0228507 A1    Oct. 13, 2005

Related U.S. Application Data

(63) Continuation of application No. PCT/EP03/12111, filed on Oct. 31, 2003.

(30) Foreign Application Priority Data
Dec. 19, 2002    (DE) ................. 102 59 415

(51) Int. Cl.
*B29C 45/00*    (2006.01)
(52) U.S. Cl. ..................... 700/200; 156/125
(58) Field of Classification Search .......... 700/200, 700/201, 159; 156/125; 246/297.2, 297.3
See application file for complete search history.

(56) References Cited

U.S. PATENT DOCUMENTS 3,566,190 A * 2/1971 Huebner et al. ......... 361/690

| | | |
|---|---|---|
| 4,703,394 A | 10/1987 | Petit et al. |
| 5,007,846 A * | 4/1991 | Ravid ................. 439/79 |
| 5,808,876 A | 9/1998 | Mullenbach et al. |
| 5,984,734 A | 11/1999 | Piper et al. |
| 6,452,785 B1 | 9/2002 | Kaaden et al. |

FOREIGN PATENT DOCUMENTS

| | | |
|---|---|---|
| DE | 92 00 939 | 4/1992 |
| DE | 196 15 093 A | 10/1997 |
| DE | 299 01 194 | 7/1999 |
| DE | 695 12 836 | 3/2000 |
| EP | 1 072 388 | 1/2001 |
| WO | WO99/14995 | 3/1999 |

* cited by examiner

*Primary Examiner*—Kidest Bahta
(74) *Attorney, Agent, or Firm*—Henry M. Feiereisen; Ursula B. Day

(57) ABSTRACT

A control apparatus for controlling a machine, especially an injection molding machine, includes a bus board providing communication connections between different units, a wiring board, and a separate process module. The process module includes one or more process boards providing a base range of input/output (I/O) connections for the machines to be controlled. The process module can be directly connected to the bus board and the wiring board by means of a plug of second or third type, and thus produces a bridge, i.e. a connection, between the bus and wiring boards, thereby reducing wiring required between these boards At least one control module, which assumes the control tasks for the machine, can be plugged into the bus board by means of a plug contacts of first type.

20 Claims, 2 Drawing Sheets

PROCESS BOARD WITH MODULAR SPC INTEGRATION AND EXPANSION

CROSS-REFERENCES TO RELATED APPLICATIONS

This application is a continuation of prior filed copending PCT International application no. PCT/EP2003/012111, filed Oct. 31, 2003, which designated the United States and on which priority is claimed under 35 U.S.C. §120, and which claims the priority of German Patent Application, Ser. No. 102 59 415.5, filed Dec. 19, 2002, pursuant to 35 U.S.C. 119(a)-(d), the subject matter of which is/are incorporated herein by reference.

BACKGROUND OF THE INVENTION

The present invention relates to a control apparatus for a machine, in particular for use in the control of an injection molding machine.

Nothing in the following discussion of the state of the art is to be construed as an admission of prior art.

The control apparatus of an injection molding machine is typically of modular construction, with various modules assuming different control tasks and providing the connection with particular controllable devices of the injection molding machine, such as, e.g., pressure sensor and motor drive. These modules are interconnected by a back plane bus and oftentimes constructed for insertion in a so-called "rack" having a back wall which has attached thereto a so-called bus board with a back plane bus. The connection between modules and back plane bus is predominantly implemented via plug contacts. Heretofore, a module provides a SPC (stored-program control) in which a safety logic of the injection molding machine is stored. In addition, the control apparatus includes a so-called wiring board for realizing the wiring including the safety circuitry of the machine and providing a voltage distribution for the control apparatus. The wiring board thus provides the voltage distribution with fuse protection, the safety circuitry including possible safety relays as well as further assemblies as well as a greatest possible portion of the wiring of the machine and its safety circuitry. A so-called process module which is securely mounted onto the wiring board has a base range for analog and digital control input and output connections to the injection molding machine. The connection between the control modules and the bus board, respectively, and the assemblies upon the wiring board is realized separately via individual cables.

Up to now, assembly of such a control has been very cumbersome because of the many separate components and thus also prone to failure. In particular the separate wiring of the individual units of the wiring board with the control modules lacked clearness and posed a risk factor. When the injection molding machine is upgraded and the number of controlling components is thereby increased, the existing control apparatus was faced with the problem to provide an adequate control operation. A further drawback resided in the necessity to individually wire each production line of injection molding machines.

It would therefore be desirable and advantageous to provide an improved control apparatus for a machine to obviate prior art shortcomings and to allow through standardization a reduction in costs and moreover is less prone to error while being flexible in use and as compact as possible.

SUMMARY OF THE INVENTION

According to one aspect of the present invention, a control apparatus for controlling a machine, in particular an injection molding machine, includes a bus board which provides a multipoint connection via a bus system and includes a first type of plug contact, and a second type of plug contact, a control module constructed to control operation of the machine and having a plug complementing the first type of plug contact for connection of the control module to the bus board, a wiring board having a third type of plug contact, and a process module having a process board and provided with a plug that complements the second type of plug contact of the bus board for connection of the process board to the bus board, and with a plug that complements the third type of plug contact of the wiring board for connection of the process board to the wiring board, wherein the process board includes a plurality of Input/output (I/O) connections to the machine to be controlled and establishes a connection between the bus board and the wiring board.

The present invention resolves prior art shortcomings by providing a bus board for establishing the communication connections between various units, preferably a local synchronous bus or field bus architecture, a wiring board, and a separate process module. The latter includes one or more process boards for providing a base range for a SPC (stored-program control). The process module is thus designed separate from the wiring board and includes plugs of second and third type, for allowing direct connection to the bus board and the wiring board and thereby providing a bridge, i.e. connection, between these two boards so as to reduce wiring therebetween. At least one control module, which assumes control tasks for the machine, is fabricated for insertion in the bus board via plug contacts of the first type. Further control modules may be, optionally, added. The control apparatus can thus easily be suited to varying machine requirements by adding additional control modules. The use of pre-fabricated plug contacts for interconnecting individual elements of the control provides flexibility, when designing the control apparatus, and decreases wiring complexity. As a consequence, the control apparatus according to the invention can be configured compact and space-saving. The use of pre-fabricated components provides additional cost reduction.

The process module provides, i.a., various digital and/or analog input and outputs by which the connection with the machine can be established. In addition, particular interfaces, like e.g. for an EEPROM, may be provided. Contacting is realized preferably via pre-fabricated plugs.

According to another fetraure of the present invention, the control module may be constructed as a CPU module for executing tasks of a SPC. Also, a bus circuitry may be provided as a control module which serves as interface to an external CPU which then assumes the SPC tasks or expands the output range of the SPC. It is, however, also possible to provide a CPU directly in the process module for the SPC tasks to thereby save slots.

The wiring board essentially includes the safety circuitry of the machine. Position switches may, for example, be directly connected which are used in accordance with the European standard EN 201 for monitoring protective doors of an injection molding machine. The program used for the supervision, the so-called safety logic, can be stored in a non-volatile memory, for which a so-called EN 201 module is used. This module may be provided on the wiring board but may also be disposed in the process module. In addition to the non-volatile memory, this module may include its own controller which processes the safety logic and is connected, for example, via an 8 bit bus with the SPC of the machine. The module operates via separate outputs the safety circuitry of the machine to be controlled and thus ensures that the machine being controlled by the control apparatus according to the invention complies with safety regulations. Thus, it is possible, for example, to switch off various voltage supplies to digital outputs for the machine in unsafe state via safety relays as hardware that are integrated on the wiring board.

Furthermore, the wiring board provides a standardized wiring to the machine to be controlled, which may be realized by plug connectors, and the voltage distribution for the entire control apparatus. The wiring board may be configured such that the provided safety circuitry can be expanded in accordance with production lines and selected options. The individual components provided in the wiring board can thus be contacted as far as possible by pre-fabricated cable bundles via plugs. Advantageously, the signals can be directly measured at the plug contacts. Variables that are frequently measured are hereby combined preferably to a 37 pole D-sub plug. Examples of components provided on the wiring board include hardware relay, safety relay, EEPROMs for the machine memory and various measuring points.

The process module may, however, also include a non-volatile memory with a safety logic as well as a controller which runs the safety logic which operates essentially the safety circuitry, arranged on the wiring board, of the machine to be controlled and thus ensures that the machine controlled by the control according to the invention complies with safety regulations.

According to another feature of the present invention, the process module can be randomly expanded by an expansion module to allow application also for machines of greater complexity. This expansion module provides additional sets of input and output (I/O) components and includes an input protective circuitry and output drive circuitries. Tthe operation is assumed by the process module.

In order to configure the control especially compact, the bus board and the wiring board may, advantageously, be designed integrally on separate regions of a single board.

The control apparatus according to the invention can be placed on a module carrier for attachment of the bus board, the wiring board, and the process board as well as possible expansion modules. It is hereby especially advantageous, when the process module is placed on the module carrier such that the process board extends in perpendicular relationship to the integral bus board and wiring board. The bus and wiring boards are supported in substantial plane-parallel relationship to the module carrier.

The bus board and the wiring board may be secured to a rear side of the module carrier, whereas the process module may be mounted to a front side of the module carrier. In this way, the input/output connections provided on the process module for the machine to be controlled are easy to access. The module carrier may be provided with openings through which the plug contacts between various modules and boards can be guided, i.e. between the control modules and the bus board as well as between bus board and wiring board, respectively, and the process board. Passageways in a region above the wiring board allow a direct routing of the connections of the safety circuitry. In addition, the module carrier may include further slots in the form of a "rack" into which the control modules can be plugged. The modules can thus easily be secured through simple plugging on the front side of the module carrier, whereby a connection between the control modules and the bus board can be established at the same time by plugs and plug contacts of first type which extend through the passageways.

The module carrier of a control according to the invention may be provided beforehand with sockets for possible expansion modules of the process module. In this way, the number of I/O connections between injection molding machine and control can be expanded. To make the control apparatus according to the invention as compact as possible and its use as flexible as possible, the input/output connections of the process module and its expansion modules can be realized as pre-fabricated front plugs.

The plug connections of first type, which provide the connection of the control modules with the bus board, may be pre-fabricated and configured such as to be applicable for digital assemblies as well as analog structural assemblies.

When using several process boards in the process module, the connection between the process boards may be realized via a transverse connection, and only one of the boards includes a plug of second and third type for connection thereof and the other boards with the bus board and wiring board. The same is true for the use of expansion modules which also are not directly connected with the boards, but have contact thereto, for example, by means of a transverse connection via the process module.

Activation of the individual elements of the control may be implemented by a high-speed field bus system providing a multipoint connection on the bus board.

The present invention realizes a standardization of the interface between control and performance of the wiring board by using a separate process board. The process module provides the bridge, i.e. the connection, between wiring board and bus board. In order to further enhance the flexibility of the control apparatus during use, further sockets for auxiliary units, like relays, can be provided on the wiring board, while random control modules can be plugged into the bus board. Moreover, diverse position measuring systems, e.g. using P interfaces and potentiometers, can be used. It is also possible to suit the cylinder recognition to actual needs and to use several inputs or pre-fabricated plug connections for data transmission. In this way, the interface to the cylinder of the injection molding machine can be standardized. As a consequence of the modularity and flexibility, the control apparatus according to the present invention can be used and easily suited for diverse production lines.

BRIEF DESCRIPTION OF THE DRAWING

Other features and advantages of the present invention will be more readily apparent upon reading the following description of currently preferred exemplified embodiments of the invention with reference to the accompanying drawing, in which.

DETAILED DESCRIPTION OF PREFERRED EMBODIMENTS

Figure 1:
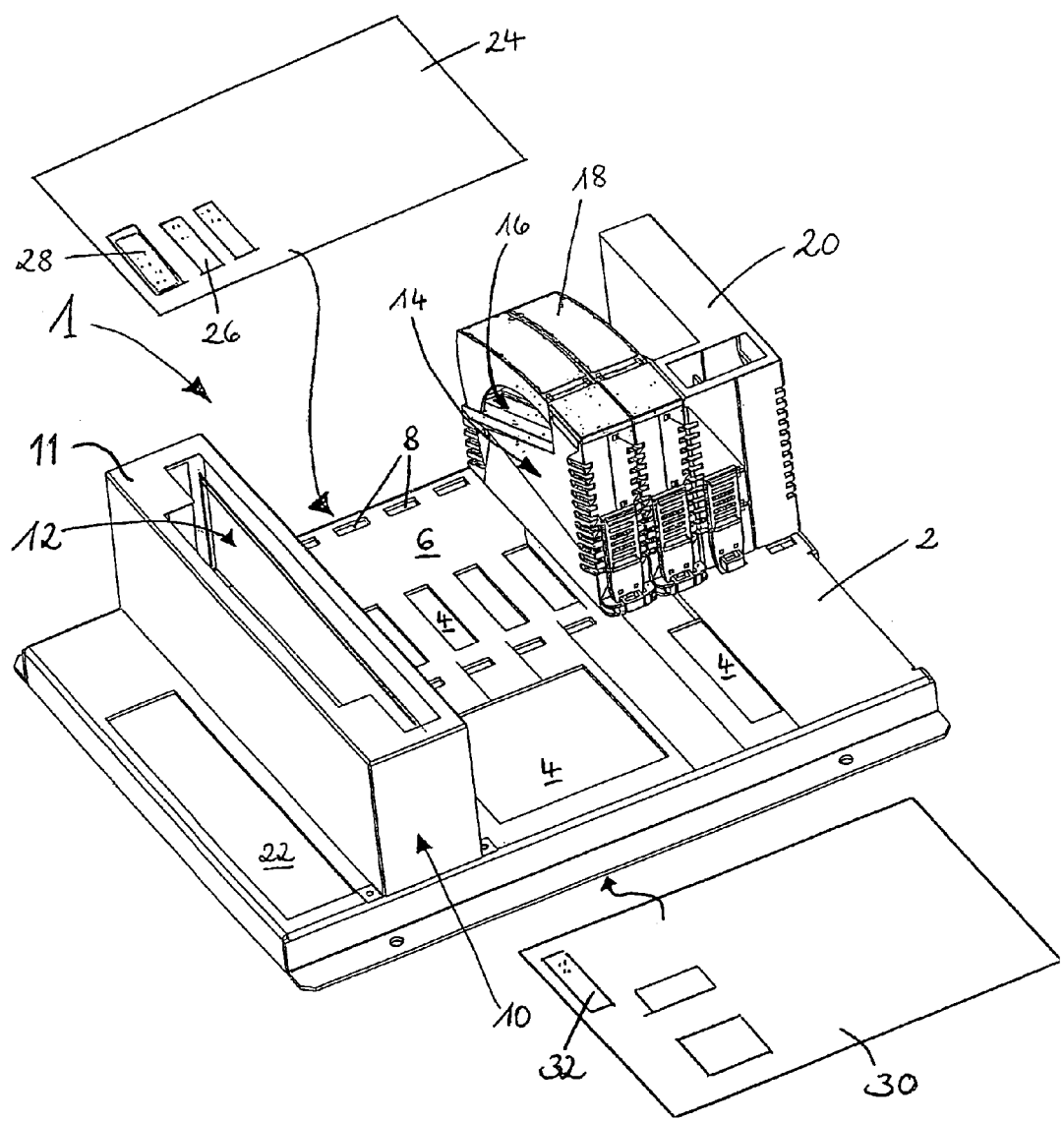
FIG. 1 is a schematic top and front perspective view of one embodiment of a control apparatus according to the present invention.

Throughout all the Figures, same or corresponding elements are generally indicated by same reference numerals. These depicted embodiments are to be understood as illustrative of the invention and not as limiting in any way. It should also be understood that the drawings are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted.

Turning now to the drawing, and in particular to FIG. 1, there is shown a schematic plan view of an embodiment of a control apparatus according to the present invention, generally designated by reference numeral 1 and provided in particular for controlling an injection molding machine. The control apparatus 1 includes a module carrier 2 made of stamped and shaped sheet metal with various openings 4, 8, 22. Retained on this module carrier 2 are various devices of the control apparatus 1. Schematically shown in FIG. 1 on the left-hand side is a process module, generally designated by reference numeral 10 and including an open-topped casing 11 and a process board 12 accommodated in the casing 11. The open top of the casing 11 allows connections of the process module 10 to be routed away. Suitably, predominantly pre-fabricated plug contacts or plugs in the form of front plugs are provided for establishing contact and guided through the open top. To the left next to the process module 10 is a socket 22 for attachment of an optional expansion module (not shown).

The region of the module carrier 2 located to the rear and right in FIG. 1 is designed as so-called rack 6 for allowing securement of the plug-in modules 14, which involve control modules, via a snap-in mechanism. Snap connection slots 8 are hereby provided in the area of the rack 6. Also provided in this area are passageways 4 through which plugs of a first type of the control modules 14 can be guided. The control modules 14 can be designed as compact control elements which provide a second contacting option via a plug contact 16 protected by a covering hood 18 and which may be provided with LEDs for indication of operation as well as other functional elements. Further provided in the area of the rack 6 is a CPU module 20 which requires in FIG. 1 two slots or, as an alternative, a bus circuitry for implementing a connection to an external CPU which assumes the functions of a control module or a SPC. The connection between the CPU module 20 or the bus circuitry and the other control modules 14 is realized via a bus board 24 disposed on the backside of the module carrier 2 in the area of the rack 6. Provided on the bus board 24 are plug contacts 26 of a first type into which the control modules 14 or the CPU module 20 can be plugged through the passageways 4. The bus board 24 includes at least one plug contact 28 of a second type via which a connection to the process board 12 of the process module 11 can be realized.

According to FIG. 1, a wiring board 30 is attached in a front and right-hand region to the back of the module carrier 2 of the control apparatus 1 according to the invention for arrangement of essentially a safety circuitry as well as the wiring of the machine to be controlled as well as a voltage distribution for the control apparatus 1. Components as well as wiring connections, shown only schematically in FIG. 1 and arranged on the wiring board 30, can be routed through the passageways 4 in the module carrier 2. The wiring board 30 further includes a plug contact of a third type 32 for allowing connection to the process board 12 of the process module 10 and via the latter to the bus board 24. Not shown is the voltage distribution, provided on the wiring board 30, for the overall control apparatus 1.

Figure 2:
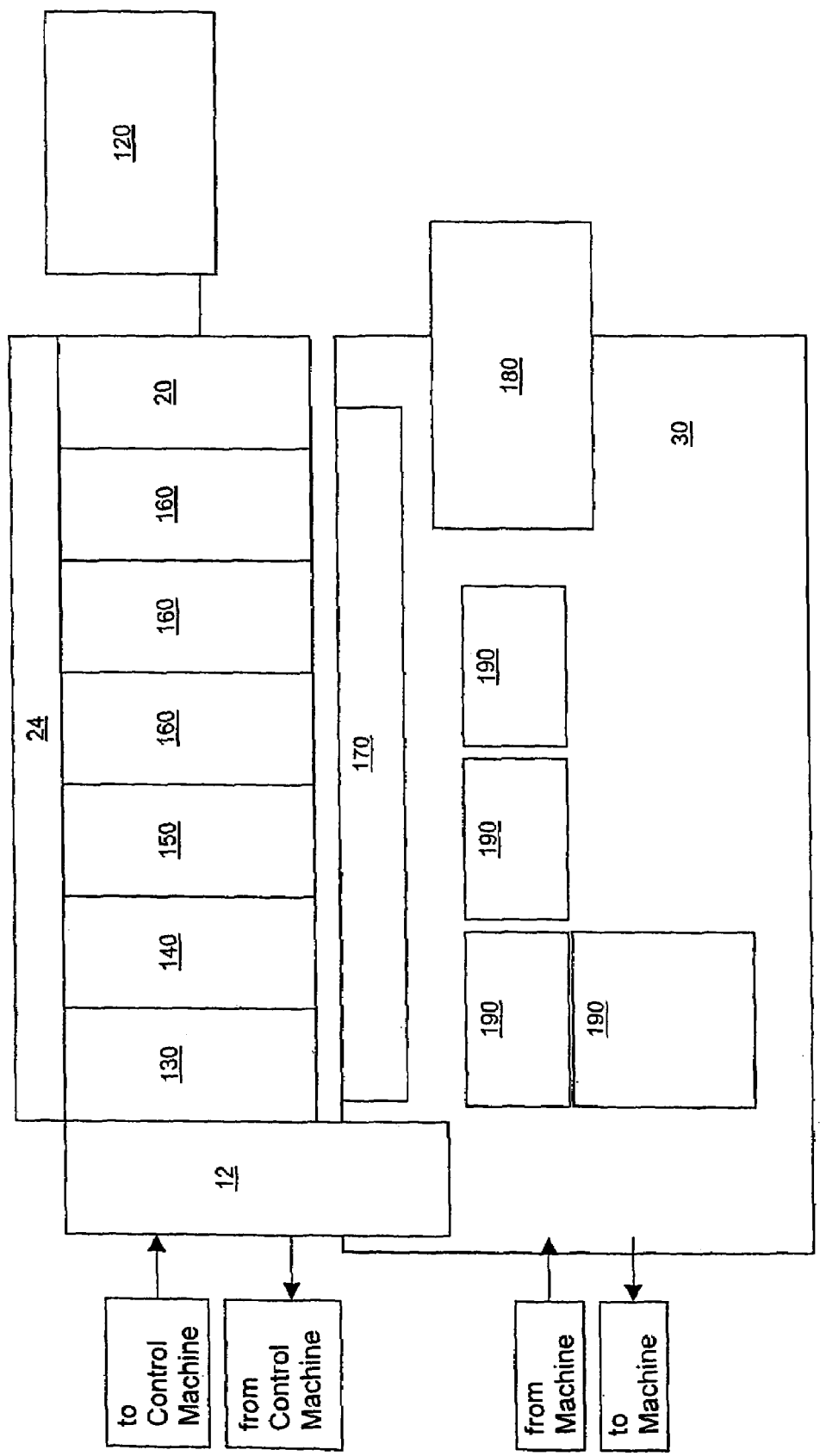
FIG. 2 is a schematic functional block diagram of the control apparatus of FIG. 1.

FIG. 2 shows a conceptual configuration of the control apparatus 1 according to the invention, whereby essential information flows are depicted schematically by arrows in boxes to the left of FIG. 2. The upper area indicates an array of control modules with possible assignments, such as, e.g., a temperature module 150, an analog mixer module 140, a P interface 130 for position measuring systems, or the like. Reference numeral 160 designates unoccupied slots which may accept further control modules, such as, for example, rare auxiliary units 120, functional devices that are dependent on the machine type, or other special options. These control modules may be integrated via the CPU 20, shown on the upper right-hand side, or via a bus wiring.

Located on the wiring board 30, shown at the bottom of FIG. 2, is the voltage distribution 170 and a fuse protection 180 for the overall control apparatus 1 as well as for the control modules. Disposed are the EN 201 module, containing the safety logic, the safety circuitry according to EN 201 for the supervision of protective doors to ensure the safety of the machine at operation, as well as various structural components 190, e.g., hardware relay, measuring points, safety relays, and elements for the fixed wiring such as bridges, eraser members, and the like. The connections to the machine are predominantly realized via pre-fabricated cable bundles so that the tendency of the wiring for errors is decreased, the clearness is enhanced, and the required space is minimized.

The process module 10, disposed in FIG. 2 on the left-hand side between the control module region and the wiring board 30 includes a SPC base range and essentially provides the input and output connections from the control to the injection molding machine. The process module 10 may include one or more process boards 12. In the event, the process module 10 accepts more than one process board 12, transverse contacts are provided to interconnect the process boards 12 and configured preferably for plug connection. The process module 10 has the task to provide bridging, i.e. the connection, between the wiring board 30 and the bus board 24. In the non-limiting illustrated embodiment, the process module 10 includes at least the following elements: 32 digital inputs, 24 digital outputs with 2 A imposition, 8 digital outputs with 0.7 A imposition, 7 analog temperature inputs, 1 KTY input for oil temperature, 4 analog outputs of +/−10 V, 3 analog differential inputs of 0-10 V, 8 digital inputs in conformity with the safety standard EN 201, as well as 4 transsonar inputs. In addition, an interface card for ultrasonic position measuring systems with P interface may be provided.

As a consequence of the modular construction of the control apparatus 1 according to the invention, i.e. in particular the option to add-on any control modules 14 to the rack 6, without exceeding a predefined space for the overall control apparatus 1, the standardized bridging of bus board 24 and wiring board 30 as a result of the use of the process module 10 according to the invention, and the expandability of the process module 10, the control apparatus 1 becomes very flexible for use with any machine production lines. This is further enhanced by the possibility to use the plug contacts 26 of first type, provided for the connection of the control modules 14 to the bus board 24, for digital as well as analog assemblies.

In order to be able to expand the control apparatus 1 in a most cost-efficient manner, when machines of greater complexity are involved, an expansion assembly may be added to the process module 10 and include, for example, 8 analog outputs of 0-10 V, 8 analog inputs of 0-10 V as well as 8 digital inputs and 8 digital outputs of 2 A. This assembly essentially includes only plug contacts for the inputs and outputs, an input protective switch as well as output driver circuits. The control is assumed by the actual process module 10.

The advantages of the present invention thus reside in the standardization of a modular control apparatus while enhancing the flexibility at the same time, so as to reduce costs and save space in the switch cabinet, and to allow an advantageous universal use of the control that can be suited to the demands at hand.

While the invention has been illustrated and described in connection with currently preferred embodiments shown and described in detail, it is not intended to be limited to the details shown since various modifications and structural changes may be made without departing in any way from the spirit of the present invention. The embodiments were chosen and described in order to best explain the principles of the invention and practical application to thereby enable a person skilled in the art to best utilize the invention and various embodiments with various modifications as are suited to the particular use contemplated.

What is claimed as new and desired to be protected by Letters Patent is set forth in the appended claims and includes equivalents of the elements recited therein:

What is claimed is:

1. A control apparatus for controlling a machine, in particular an injection molding machine, comprising:
    a bus board which provides a multipoint connection via a bus system and includes a first type of plug contact, and a second type of plug contact;
    a control module constructed to control operation of the machine and having a plug complementing the first type of plug contact for connection of the control module to the bus board;
    a wiring board having a third type of plug contact; and
    a process module having a process board and provided with a plug that complements the second type of plug contact of the bus board for connection of the process board to the bus board, and with a plug that complements the third type of plug contact of the wiring board for connection of the process board to the wiring board, said process board including a plurality of I/O connections to the machine to be controlled and establishing a connection between the bus board and the wiring board.

2. The control apparatus of claim 1, wherein the control module is constructed as a CPU module.

3. The control apparatus of claim 1, wherein the control module is constructed as a bus wiring to an external CPU.

4. The control apparatus of claim 1, wherein the wiring board is constructed to include a safety circuitry, a wiring for the machine to be controlled, and a voltage distribution.

5. The control apparatus of claim 4, wherein the wiring board is constructed to include a non-volatile memory with a safety logic and a controller to operate the safety circuitry.

6. The control apparatus of claim 4, wherein the process module is constructed to include a non-volatile memory with a safety logic and a controller to operate the safety circuitry disposed on the wiring board.

7. The control apparatus of claim 1, wherein the process module is constructed to include a CPU for executing tasks of a SPC.

8. The control apparatus of claim 1, wherein the process module includes an expansion module which includes further I/O assemblies, output driver circuits and/or input protective circuitry.

9. The control apparatus of claim 1, further comprising a single board for integral attachment of the wiring board and the bus board on separate regions of the single board.

10. The control apparatus of claim 1, further comprising a module carrier for attachment of the process module, the wiring board and the bus board.

11. The control apparatus of claim 10, wherein the process module is arranged on the module carrier such that the process board extends in perpendicular relationship to the wiring board and the bus board.

12. The control apparatus of claim 10, wherein the wiring board and the bus board are mounted on a backside of the module carrier, and the process module is mounted on a front side of the module carrier.

13. The control apparatus of claim 10, wherein the module carrier has openings through which the plugs of the control and process modules are guidable for connection to the plug contacts of the bus and wiring boards.

14. The control apparatus of claim 10, wherein the module carrier has a snap-in connection slots for attachment of the control module.

15. The control apparatus of claim 10, wherein the module carrier is provided with a socket for attachment of an expansion module of the process module.

16. The control apparatus of claim 1, wherein the I/O connections of the process module are made in the form of pre-fabricated front plugs.

17. The control apparatus of claim 15, wherein the expansion module has I/O connections in the form of pre-fabricated front plugs.

18. The control apparatus of claim 1, wherein the first type of plug contact is pre-fabricated and so constructed as to establish a plug connection for digital as well as analog assemblies.

19. The control apparatus of claim 10, wherein the process module has more than one of said process board linked by a transverse connection.

20. The control apparatus of claim 10, wherein the module carrier is made of sheet metal.

* * * * *